(12) United States Patent
Miki et al.

(10) Patent No.: US 8,779,573 B2
(45) Date of Patent: Jul. 15, 2014

(54) SEMICONDUCTOR PACKAGE HAVING A SILICON REINFORCING MEMBER EMBEDDED IN RESIN

(75) Inventors: Syota Miki, Nagano (JP); Takaharu Yamano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 135 days.

(21) Appl. No.: 13/170,319

(22) Filed: Jun. 28, 2011

(65) Prior Publication Data

US 2011/0316152 A1 Dec. 29, 2011

(30) Foreign Application Priority Data

Jun. 29, 2010 (JP) ................................. 2010-147950

(51) Int. Cl.
| | |
|---|---|
| H01L 23/24 | (2006.01) |
| H01L 23/48 | (2006.01) |
| H01L 23/04 | (2006.01) |
| H01L 23/52 | (2006.01) |
| H01L 23/00 | (2006.01) |
| H01L 21/56 | (2006.01) |

(52) U.S. Cl.
CPC ....... *H01L 24/19* (2013.01); *H01L 2224/02333* (2013.01); *H01L 2924/01033* (2013.01); *H01L 2924/01029* (2013.01); *H01L 2924/01005* (2013.01); *H01L 2924/01006* (2013.01); *H01L 2924/18162* (2013.01); *H01L 24/20* (2013.01); *H01L 2224/12105* (2013.01); *H01L 2224/97* (2013.01); *H01L 2924/014* (2013.01); *H01L 2924/01079* (2013.01); *H01L 21/568* (2013.01); *H01L 21/561* (2013.01)
USPC ............ 257/687; 257/690; 257/730; 257/737

(58) Field of Classification Search
CPC .......................... H01L 23/3171; H01L 23/3185
USPC .................. 438/112; 257/687, 690, 730, 737, 257/E23.131, E23.133
See application file for complete search history.

(56) References Cited

U.S. PATENT DOCUMENTS

| 8,304,915 B2 | 11/2012 | Mori et al. | |
|---|---|---|---|
| 2006/0145322 A1* | 7/2006 | Takahashi et al. | ............ 257/678 |

(Continued)

FOREIGN PATENT DOCUMENTS

| JP | 2002-246507 | 8/2002 |
|---|---|---|
| JP | 2004-072032 | 3/2004 |

(Continued)

OTHER PUBLICATIONS

Office Action dated Dec. 18, 2012 issued with respect to the related Japanese Patent Appliction No. 2009-243897.
Office Action dated Dec. 3, 2013 issued with respect to the basic Japanese Patent Application No. 2010-147950.

*Primary Examiner* — Kevin Parendo
(74) *Attorney, Agent, or Firm* — IPUSA, PLLC

(57) ABSTRACT

Semiconductor chips are placed in recesses of a support carrier with electrode surfaces facing upward in a state where the semiconductor chips are arranged separately from each other. A seal resin part is formed by encapsulating the semiconductor chips by an insulating resin on said support carrier. Rewiring patterns are formed on a top surface of the seal resin part. External connection terminals are formed on the rewiring patterns. Bottom parts of the recesses of the support carrier are removed from the seal resin part while maintaining reinforcing members of the support carrier to be remained. The semiconductor packages are individualized by cutting the seal resin part along an outside of each reinforcing member.

3 Claims, 12 Drawing Sheets

(56) References Cited

U.S. PATENT DOCUMENTS

| | | | |
|---|---|---|---|
| 2006/0255440 A1* | 11/2006 | Miyazaki et al. | 257/679 |
| 2009/0137085 A1* | 5/2009 | Tsukano et al. | 438/121 |
| 2009/0250257 A1* | 10/2009 | Sunohara et al. | 174/260 |
| 2010/0112804 A1 | 5/2010 | Kobayashi et al. | |

FOREIGN PATENT DOCUMENTS

| | | |
|---|---|---|
| JP | 2004-095836 | 3/2004 |
| JP | 2004-327856 | 11/2004 |
| JP | 4420965 | 2/2010 |
| WO | WO2010/010911 | 1/2010 |

* cited by examiner

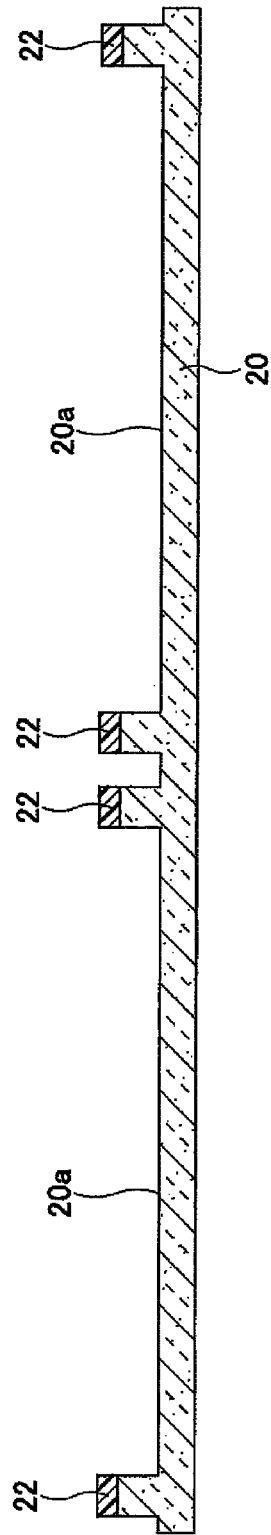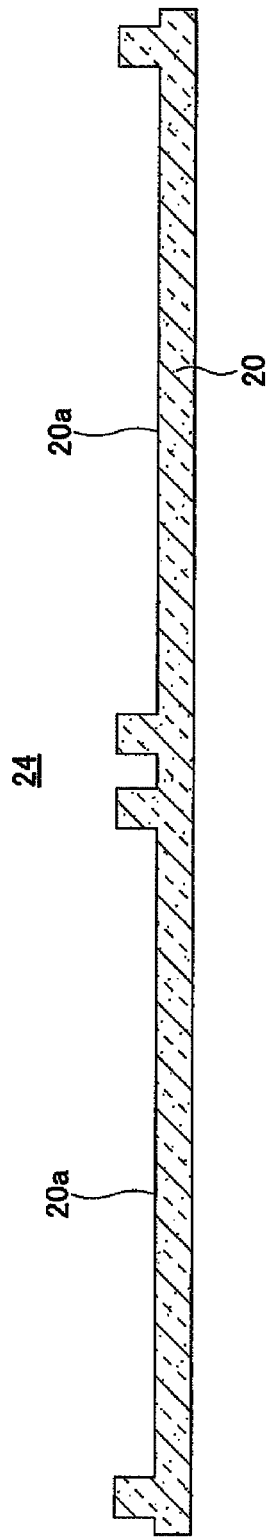

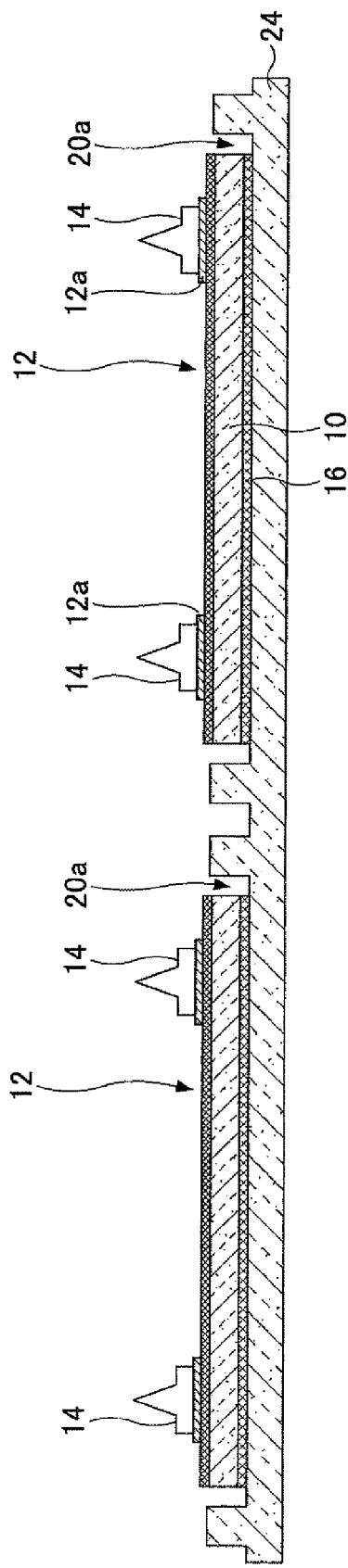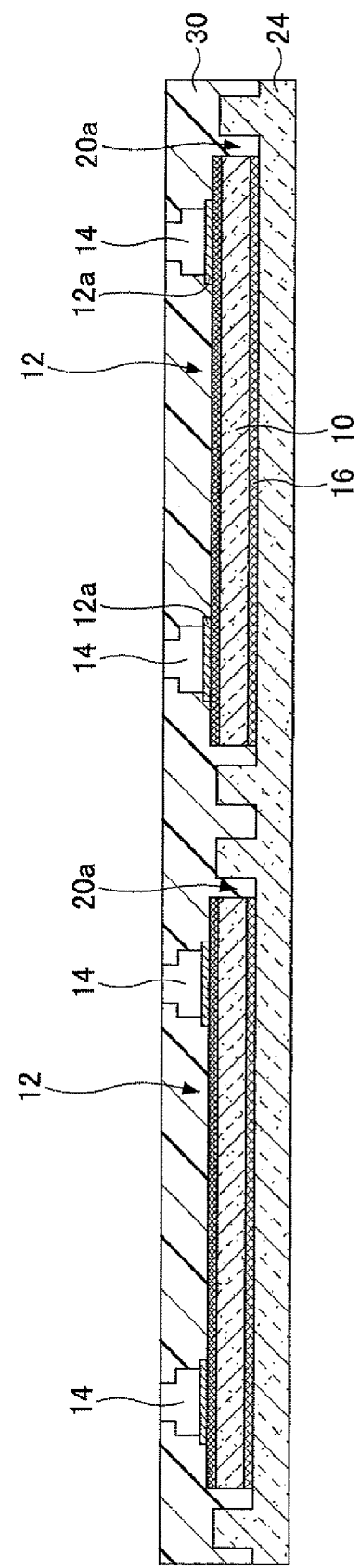

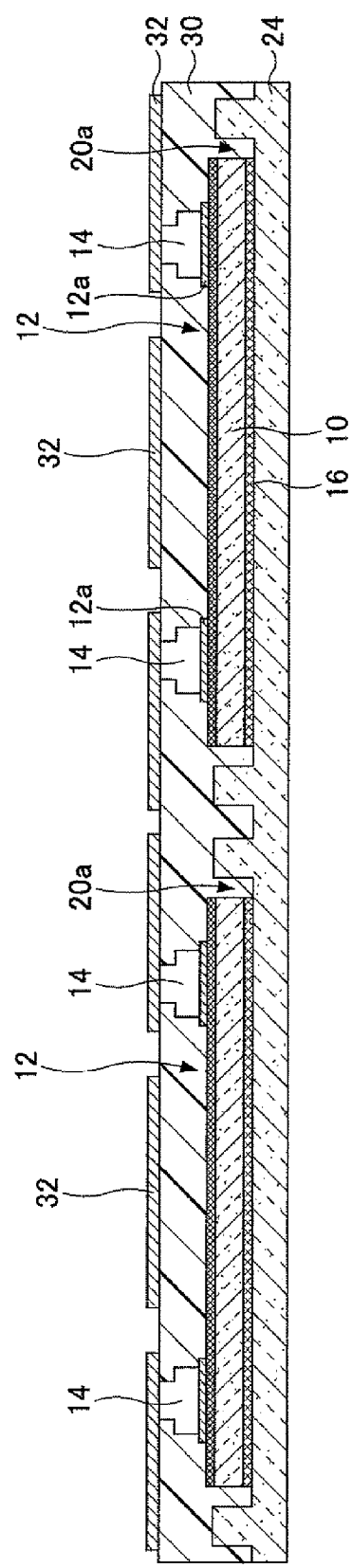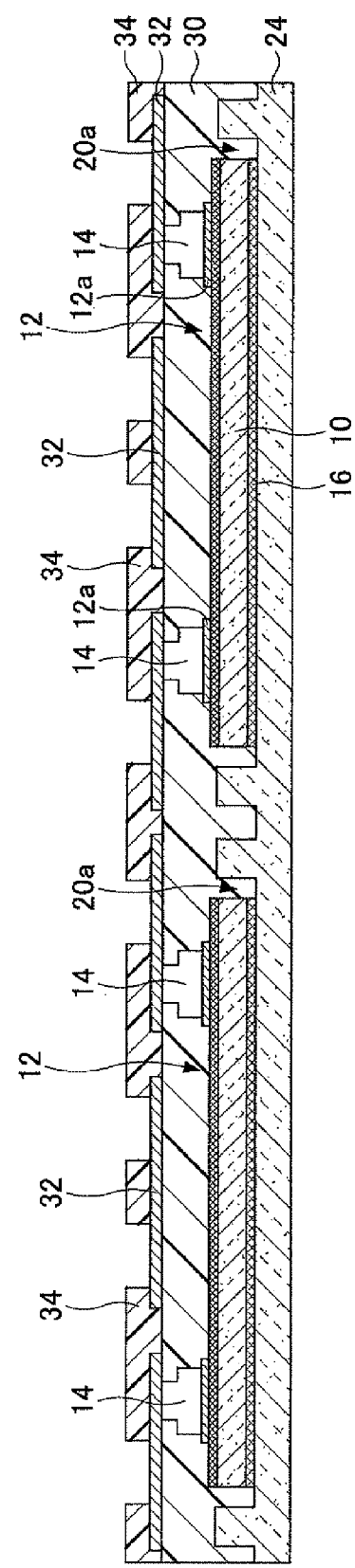

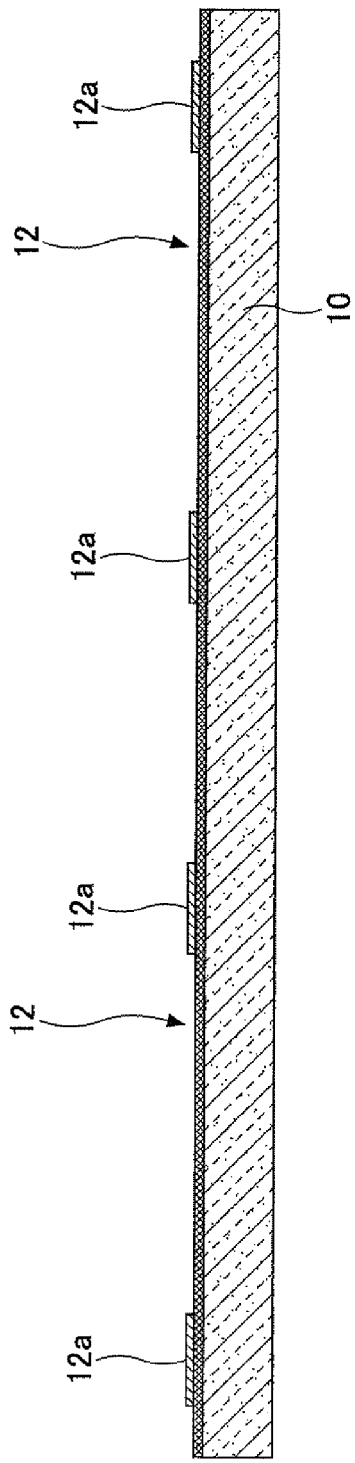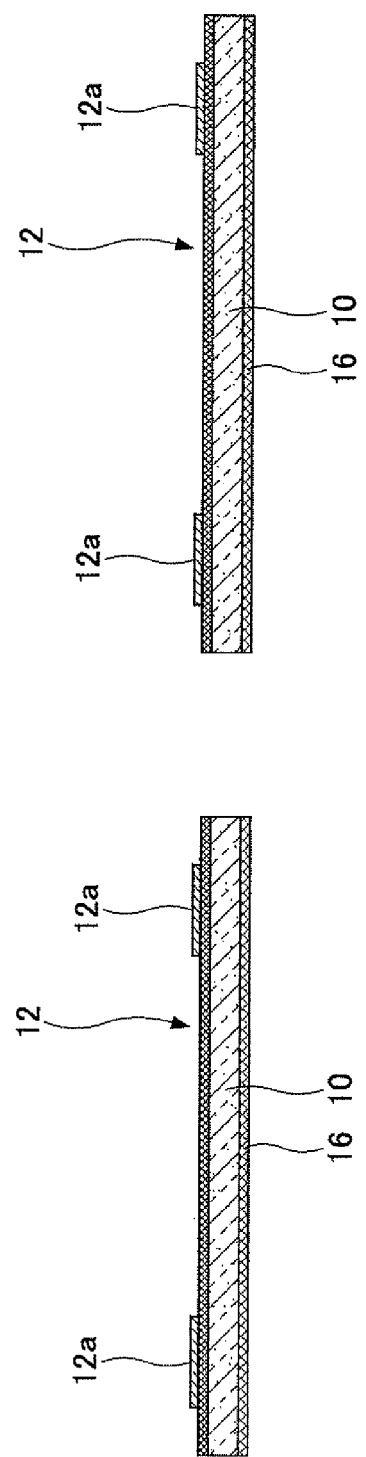

SEMICONDUCTOR PACKAGE HAVING A SILICON REINFORCING MEMBER EMBEDDED IN RESIN

CROSS-REFERENCE TO RELATED APPLICATIONS

This application is based upon and claims the benefit of priority of the prior Japanese Patent Application No. 2010-147950, filed on Jun. 29, 2010, the entire contents of which are incorporated herein by reference.

FIELD

The embodiment discussed herein is directed to a chip-scale semiconductor package and a manufacturing method thereof.

BACKGROUND

In recent years, with an increase in a number of external connection terminals of a semiconductor chip, it has become difficult to provide a necessary number of external connection terminals in a so-called fan-in chip-scale semiconductor package (fan-in CSP) in which the external connection terminals are accommodated within a plane area of the semiconductor chip. Thus, the number of external connection terminals is increased by using a fan-out chip-scale semiconductor package (fan-out CSP) in which the external connection terminal is provided outside the plane area of the semiconductor chip.

The fan-out chip-scale semiconductor package (fan-out CSP) has a portion in which a seal resin part protrudes outside from a semiconductor chip so that external connection terminals are provided in that portion. Accordingly, it is necessary to form the seal resin part having such a part protruding outside from the semiconductor chip. In order to form such a seal resin part, Published Japanese Patent No. 4420965 suggests a manufacturing method of a semiconductor package in which semiconductor chips are arranged on a sheet-like support carrier by being separated from each other by a predetermined distance after individualizing the semiconductor chips formed on a wafer, and, then, the semiconductor chips are molded by a seal resin again and individualized into each semiconductor chip.

According to the above-mentioned manufacturing method of semiconductor packages, the resin-encapsulation process must be performed twice such that the semiconductor chips are resin-encapsulated on a wafer, and, thereafter, the semiconductor chips are individualized and arranged on the support carrier, and are resin-encapsulated again. The resin-encapsulation process includes a resin-filing process and a resin-curing process, which require a long process time. Accordingly, it is desirable to perform the resin-encapsulation process only one time.

Moreover, although a support carrier is used to rearrange the semiconductor chips which are individualized once, a cost corresponding to the support carrier is included in the manufacturing cost of the semiconductor chips because the support carrier is a consumable item to be removed after the resin encapsulation. Additionally, there may be a problem in that if a thickness of the seal resin is small, cracking or chipping may occur in the semiconductor chips after removal of the support carrier. Further, if the resin-encapsulation process is performed twice, cracking may occur in the seal resin part due to a weak adhesion between the seal resin formed first and the seal resin formed second or due to a stress concentration occurring at a portion between the seal resin formed first and the seal resin formed second.

Thus, it is desirable to develop a semiconductor package and a manufacturing method of semiconductor packages that can solve the above-mentioned problems.

SUMMARY

According to an aspect of the invention, a manufacturing method of manufacturing semiconductor packages, includes: placing a plurality of semiconductor chips in recesses of a support carrier with electrode surfaces facing upward in a state where the semiconductor chips are arranged separately from each other; forming a seal resin part by encapsulating the semiconductor chips by an insulating resin on the support carrier; forming rewiring patterns on a top surface of the seal resin part; forming external connection terminals on the rewiring patterns; removing bottom parts of the recesses of the support carrier from the seal resin part while maintaining reinforcing members of the support carrier to be remained; and individualizing the semiconductor packages by cutting the seal resin part along an outside of the reinforcing members.

According to another aspect, a semiconductor package includes: a semiconductor chip; a seal resin part formed to cover side surfaces of bumps formed on electrodes of the semiconductor chip; a rewiring pattern formed on a top surface of the seal resin part; a solder resist layer formed on the rewiring pattern and a top surface of the seal resin part except for portions where pads for external connection terminals are formed; and a reinforcing member embedded in the seal resin part, the reinforcing member having a frame shape to surround the semiconductor chip.

Accordingly, the process of forming a seal resin part to seal the semiconductor chip and the process of forming a seal resin part extending outside the semiconductor chip can be performed simultaneously in one process. Thus, the seal resin part can be formed outside the semiconductor chip without performing the seal-resin forming process twice, and a fan-out semiconductor package can be manufactured at a low cost by arranging external connection terminals in the seal resin part outside the semiconductor chip.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

BRIEF DESCRIPTION OF DRAWINGS

FIGS. 3A, 3B, 3C and 3D are cross-sectional views for explaining a process of forming a support carrier;

FIG. 5 is a cross-sectional view of the support carrier having semiconductor chips accommodated in the recesses thereof;

FIG. 6 is a cross-sectional view of the semiconductor chips on which a seal resin part is formed;

FIG. 7 is a cross-sectional view of the semiconductor chips covered by the seal resin part on which wiring patterns are formed;

FIG. 8 is a cross-sectional view of the semiconductor chips having the wiring patterns on which a solder resist is formed;

FIGS. 13A and 13B are cross-sectional views for explaining a process of preparing a semiconductor chip having no metal bump.

DESCRIPTION OF EMBODIMENT(S)

Preferred embodiment of the present invention will be explained with reference to the accompanying drawings.

Figure 1:
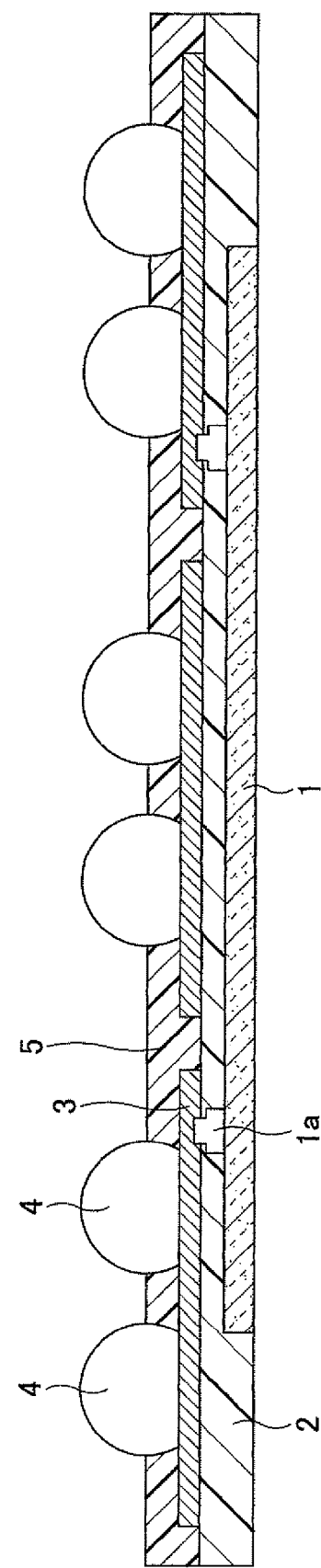
FIG. 1 is a cross-sectional view of a fan-out chip-scale semiconductor package.

First, a description is given of a fan-out chip-scale semiconductor package to which a manufacturing method according to the present invention is applicable. FIG. 1 is a cross-sectional view of a fan-out chip-scale semiconductor package. A circuit formation surface and side surfaces of a semiconductor chip 1 made of silicon are covered by a seal resin 2. Electrodes 1a of the semiconductor chip 1 are connected to rewiring patterns 3 formed on the seal resin 2. Solder bumps 4 are formed as external connection terminals on the rewiring patterns 3. Portions of the rewiring patterns other than portions where the solder bumps are provided are covered by a dry film solder resist (DFSR) 5. The seal resin 2 extends to a circumference of the semiconductor chip 1 so that the rewiring patterns 3 are formed on the extending portion of the rewiring patterns 3. Thereby, the solder bumps 4 can be arranged in an area outside the semiconductor chip.

Next, a description will be given of a manufacturing method of semiconductor packages according to an embodiment of the present invention.

Figure 2A:
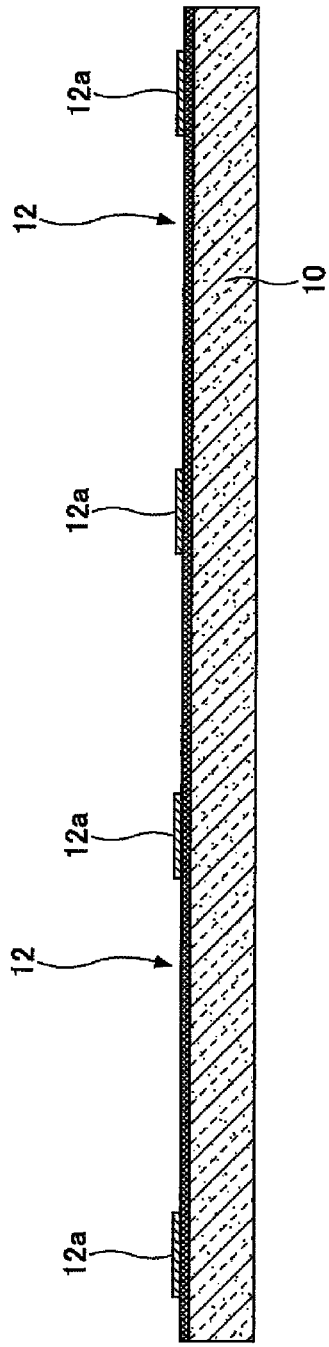
FIGS. 2A, 2B and 2C are cross-sectional views for explaining a process of preparing individualized semiconductor chips.
Figure 2B:
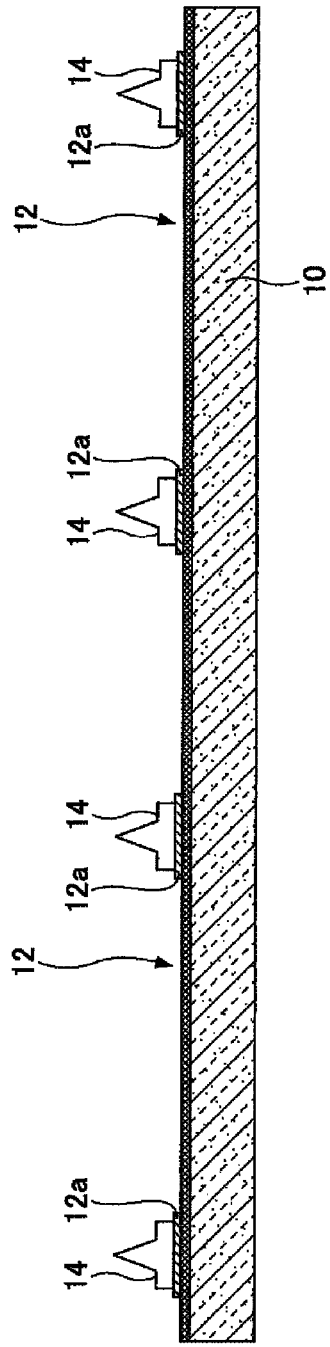
Figure 2C:
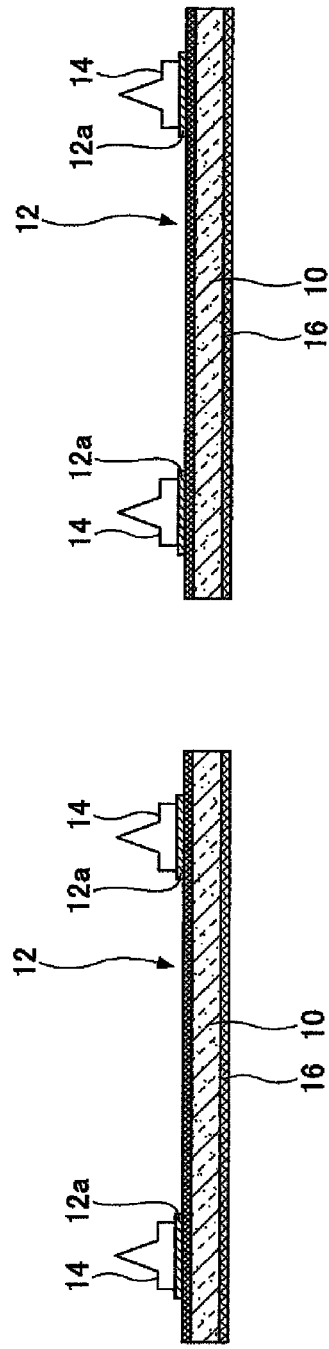

First, a process of preparing individualized semiconductor chips is explained with reference to FIGS. 2A, 2B and 2C. As illustrated in FIG. 2A, a silicon wafer 10 is prepared as a semiconductor substrate, and a plurality of semiconductor chips 12 are formed on the silicon wafer 10. Electrodes 12a are formed on the semiconductor chips 12. In FIGS. 2A, 2B and 2C, a portion of the silicon wafer 10 (a portion including two semiconductor chips 12), the silicon wafer 10 has a circular shape and the semiconductor chips 12 are arranged on the silicon wafer 10 in a matrix state.

Then, as illustrated in FIG. 2B, metal bumps are formed on the electrodes 12a of the semiconductor chips 12. In the present embodiment, gold bumps are formed as the metal bumps 14 on the electrodes 12a. Subsequently, as illustrated in FIG. 2C, after applying back grinding to the silicon wafer 10, a die attachment film 16 is applied to the back surface of the silicon wafer 10. Thereafter, the semiconductor chips 12 are individualized into each piece by cutting the silicon wafer 10 by dicing.

Figure 3A:
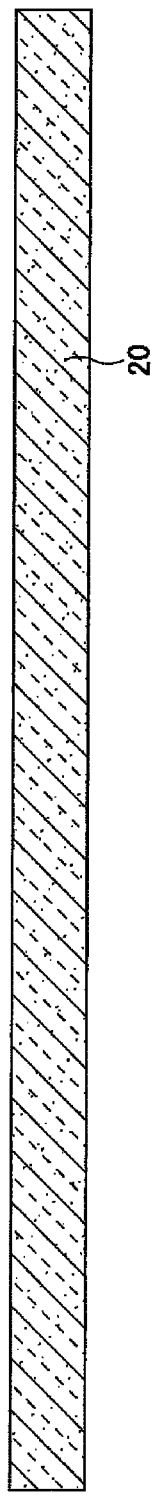

Next, a description will be given, with reference to FIGS. 3A through 3D, of a manufacturing process of a support carrier used in the present embodiment. First, a dummy wafer 20 is prepared as illustrated in FIG. 3A. It is assumed that a silicon wafer, the same as the wafer for forming the semiconductor chips 12, is used as the dummy wafer 20. Although a portion of the dummy wafer 20 is illustrated in FIGS. 3A through 3D, the dummy wafer 20 has a circular shape and a plurality of recesses 20a, each of which accommodates the semiconductor chip 12, are formed on the dummy wafer 20 by being arranged in a matrix state.

Figure 3B:
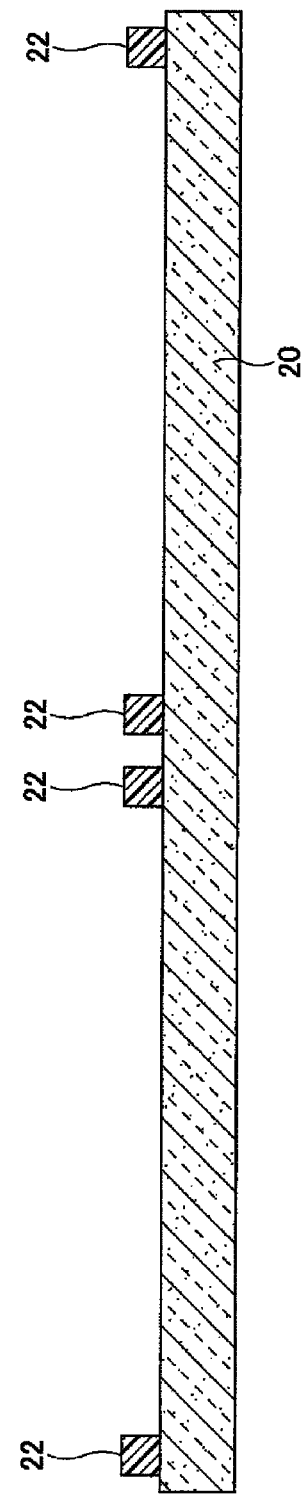
Figure 4:
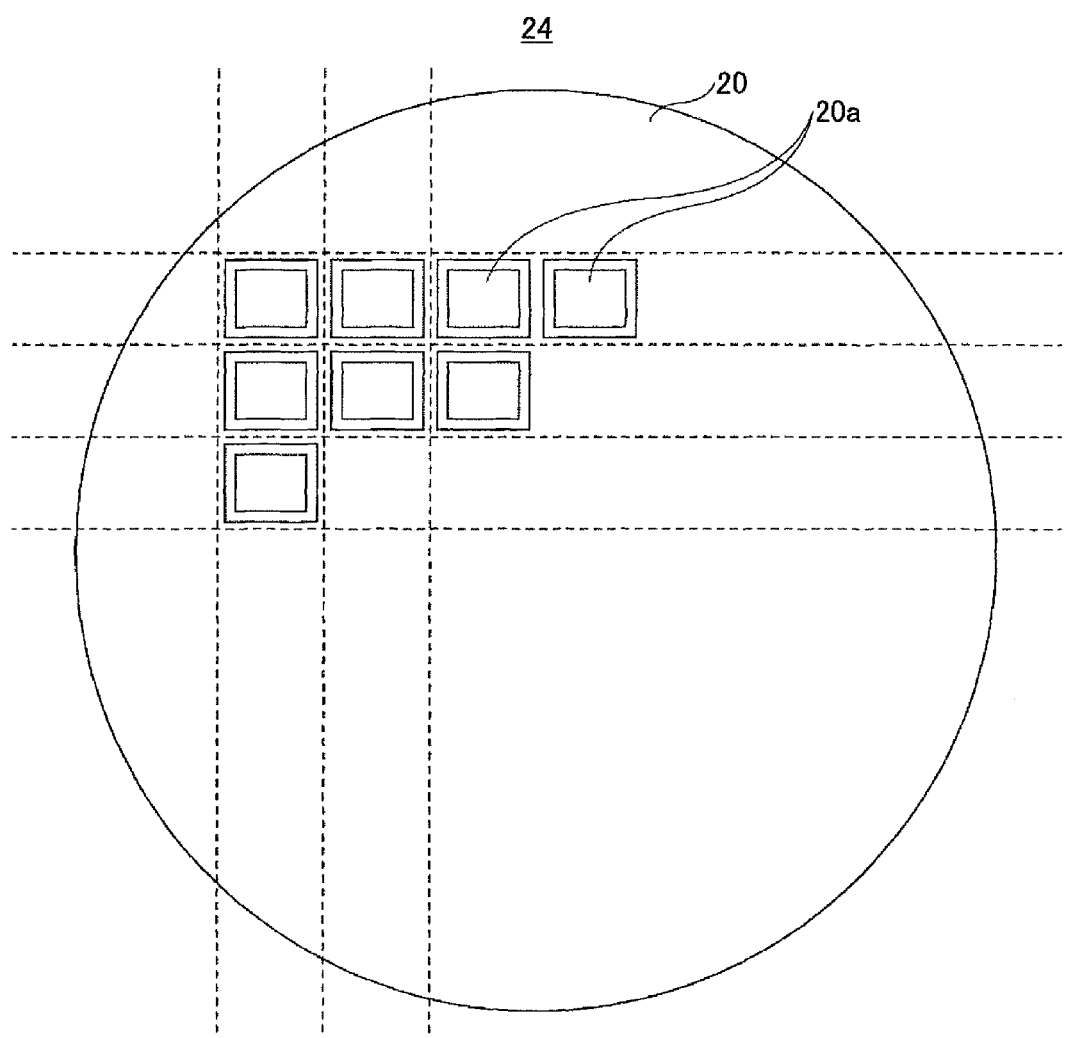
FIG. 4 is a plan view of a support carrier having recesses to accommodate semiconductor chips therein.

A mask 22 is formed as illustrated in FIG. 3B by forming and patterning a dry film resist (DFR) on the dummy wafer 20. Subsequently, a wet-blasting process is applied to a surface (the side where the mask 22 is provided) of the dummy wafer 20. Portions of the dummy wafer 20 other than the portions where the mask 22 is formed is removed by the wet-blasting process, thereby forming recesses 20a on the dummy wafer 20 as illustrated in FIG. 3C and FIG. 4. Then, the mask 22 of the dry film resist is separated from the dummy wafer 20, and a support carrier 24 made of silicon is completed as illustrated in FIG. 3D. Each of the recesses 20a of the support carrier 24 has a size and shape to accommodate the individualized semiconductor chip 12 illustrated in FIG. 2C.

Fan-out semiconductor packages are manufactured using the above-mentioned semiconductor chips and the support carrier 24.

First, as illustrated in FIG. 5, the semiconductor chips 12 are placed on the support carrier 24. The semiconductor chips 12 are arranged in the respective recesses 20a of the support carrier 24 with the metal bumps 14 facing upward, and are applied to the bottom surfaces of the recesses 20a by the die attachment film 16. The plan view shape of each recess 20a is slightly larger than the contour of each semiconductor chip 12 so that a small gap is formed between the side surfaces of the semiconductor chip and corresponding inner surfaces 20a of the recesses 20a.

Then, as illustrated in FIG. 6, an insulating resin is arranged on the surface of the support carrier 24 to cover the semiconductor chips 24, and a top surface of the insulating resin is flattened to form a seal resin part 30. At this time, top surfaces of the metal bumps 14 are also pressed to be flattened so that the metal bumps 14 are exposed on the top surface of the seal resin part 30. The seal resin part 30 does not only surround the semiconductor chips 12 but also encapsulates circumferences of the recesses 20a of the support carrier. Thus, viewing from above, the seal resin part 30 extends from the contours of the semiconductor chips 12.

Figure 9:
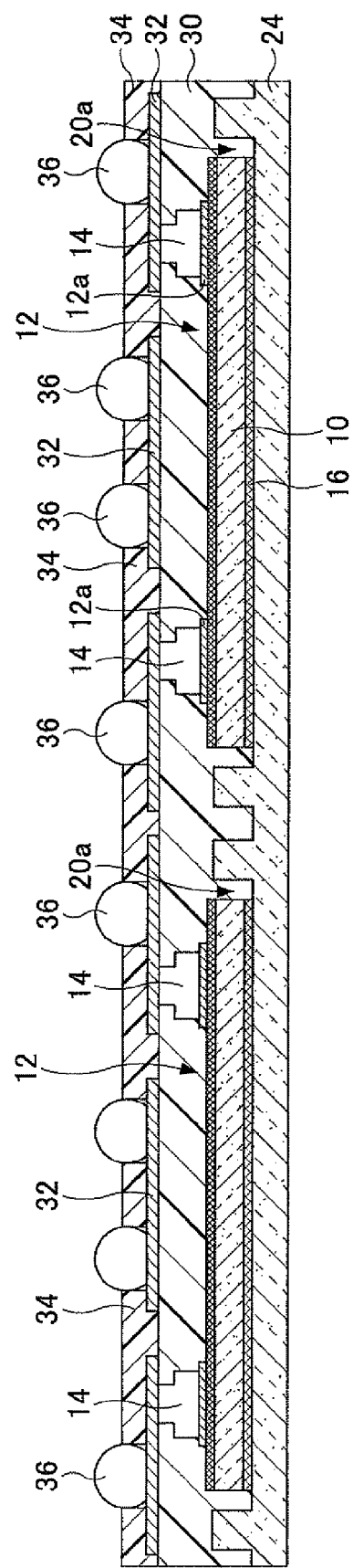
FIG. 9 is a cross-sectional view of the semiconductor chips covered by the seal resin part on which the wiring patterns and solder bumps are formed.

Then, as illustrated in FIG. 7, a rewiring pattern 32 is formed on the top surface of the seal resin part 30 using a known semi-additive method. The rewiring pattern 32 extends to the seal resin part 30 extending outside the semiconductor chips 12. Then, as illustrated in FIG. 8A dry film solder resist (DFSR) 34 is formed on the rewiring pattern 32. The dry film solder resist (DFSR) 34 is not provided in portions where the external connection pads are to be formed. Thus, in the portions where the pads are not formed, the rewiring patterns 32 are exposed to be the external connection pads. Then, as illustrated in FIG. 9, the solder bumps 36 are formed on the external connection pads where the rewiring pattern 32 is exposed from the dry film solder resist (DFSR) 34.

After the solder bumps 36 are formed, the support carrier 24 is removed by back grinding. At this time, the support carrier 24 is removed to the bottom surfaces of the recessed 20a. The back grinding is ended when the back surfaces of the semiconductor chips 12 are exposed. Thereby, portions forming the side surfaces of the recesses 20a of the support carrier 24 remain in the seal resin part 30.

Figure 10:
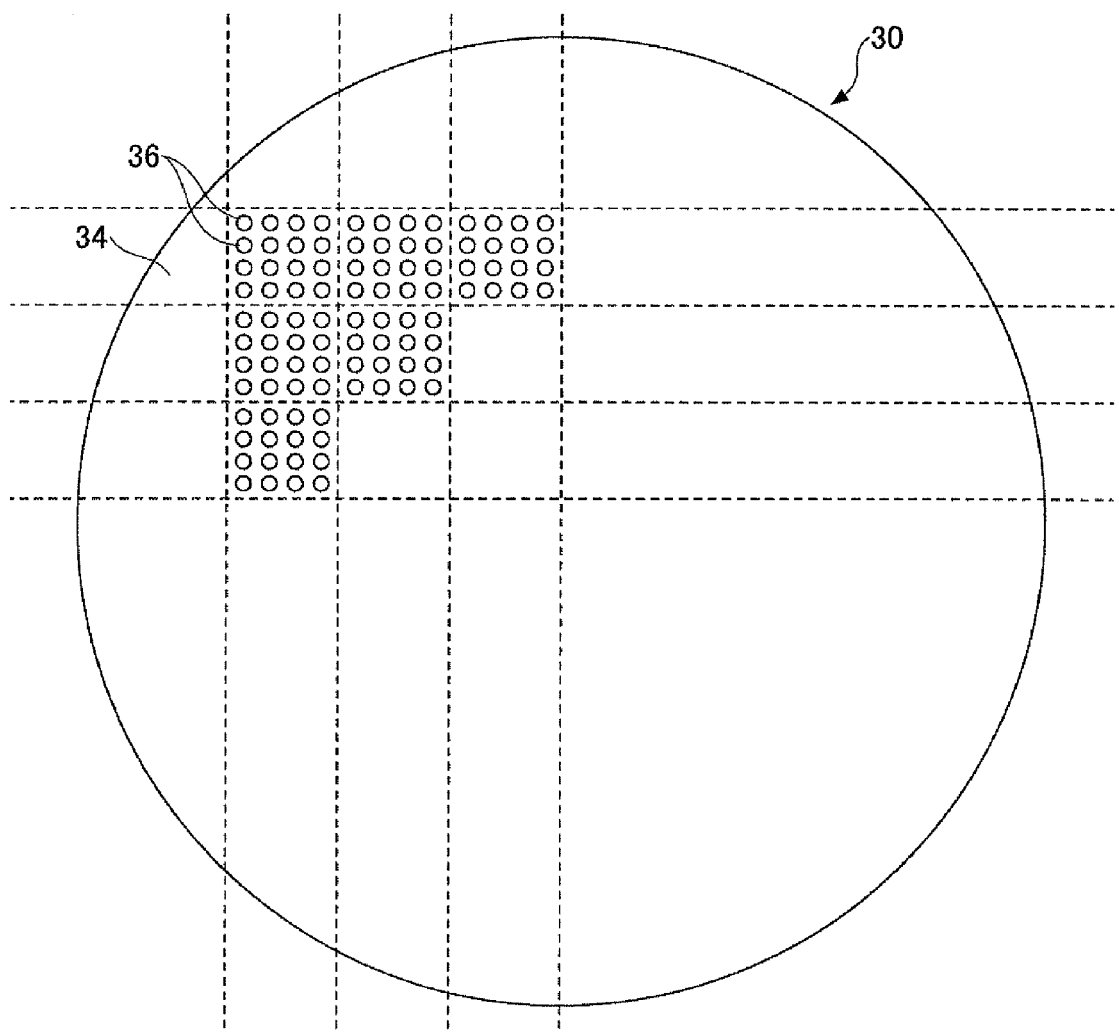
FIG. 10 is a plan view of the seal resin part on which the solder bumps are formed.

FIG. 10 is a plan view illustrating the entire seal resin part 30 after the solder bumps 36 are formed. The seal resin part 30 has a circular shape similar to the support carrier 24, and the semiconductor chips 12 are embedded in the seal resin part 30 by being arranged in a matrix state. The solder bumps 36 are formed in a portion of the seal resin part 30 covering each semiconductor chip 12.

Figure 11:
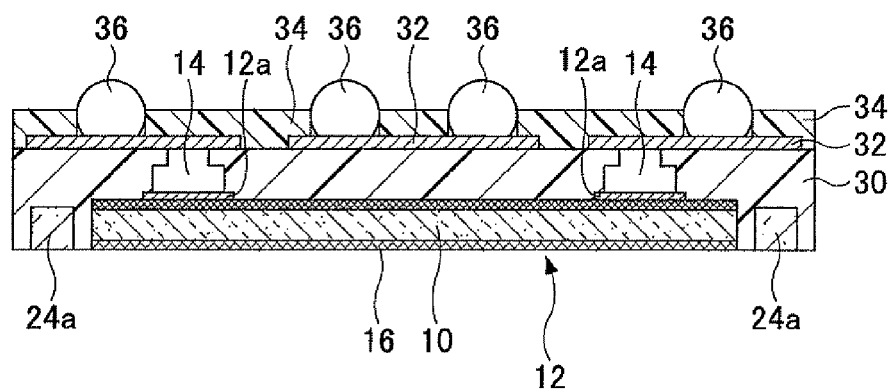
FIG. 11 is a cross-sectional view of an individualized semiconductor package.
Figure 12:
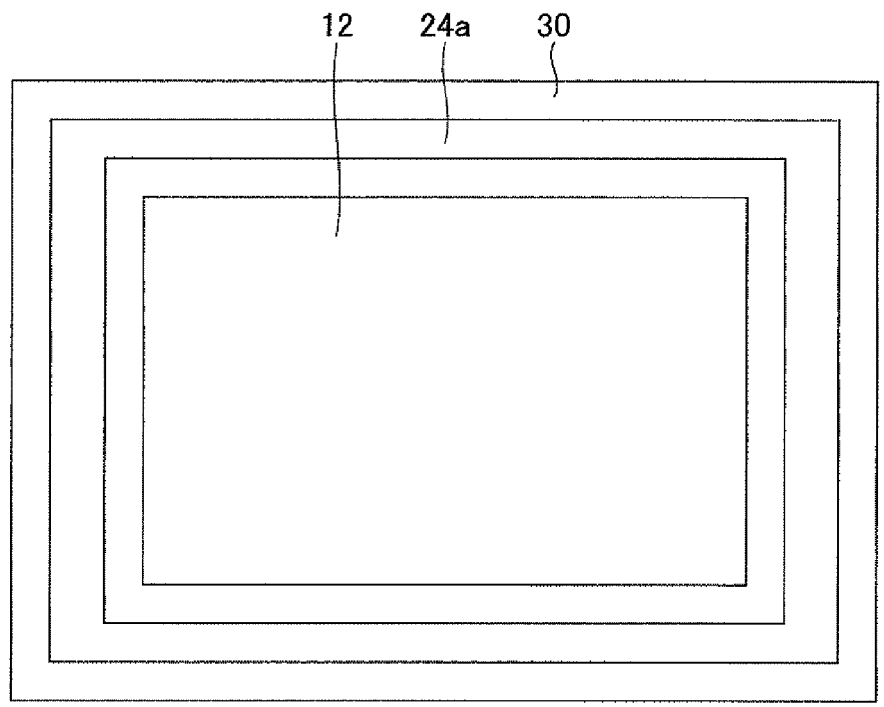
FIG. 12 is a plan view of a back surface of the semiconductor package.
Figure 14:
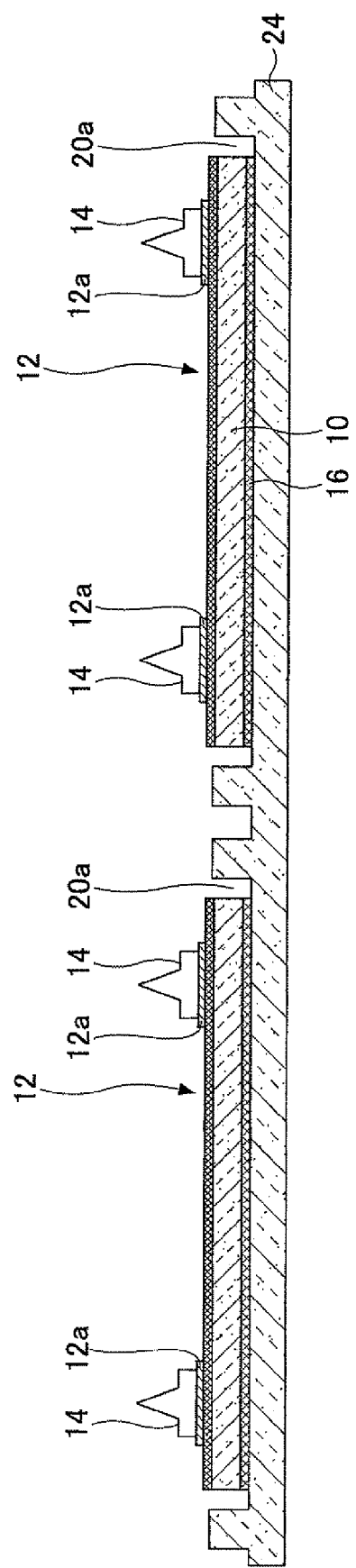
FIG. 14 is a cross-sectional view of the semiconductor chips mounted on a support carrier for explaining a process of forming metal bumps on the semiconductor chips.

Thereafter, the seal resin part 30 is cut by dicing or the like along dashed lines indicated in FIG. 10 in order to individualize the semiconductor packages 40 each of which has the semiconductor chip 12 encapsulated in the seal resin part 30 as illustrated in FIG. 11. FIG. 12 is a plan view of the back surface of the semiconductor package 40. The back surface of the semiconductor chip 12 is exposed in the center portion of the back surface of the semiconductor package 40. The seal resin part 30 extends to outside of the semiconductor chip 12, and the solder bumps 36 are formed on the seal resin part 30 as illustrated in FIG. 11. Portions other than the solder bumps 36 are covered by the dry film solder resist (DFER) 34. Thereby, the semiconductor package 40 is formed as a fan-out semiconductor package.

Here, in the process of removing the support carrier 24 by back grinding, if the back grinding is stopped at a time when the back surfaces of the semiconductor chips 12 appear in the surface being ground, portions of the support carrier 24 forming the recesses 20a outside the semiconductor chips 12 remain within the seal resin part 30. That is, the frame-shaped part 24a of the support carrier 24 remains in an embedded state in the circumferential portion of the seal resin part 30 of the completed semiconductor package 40 as illustrated in FIG. 12. The frame-shaped part 24a is a portion of the support carrier 24 and is formed of silicon. Thus, the frame-shaped part 24a has larger rigidity than the seal resin part 30, and provides an effect that the frame-shaped part 24a can serve as a reinforcing member that reinforces the seal resin part 30 extending outside the semiconductor chip 12. Especially, if the thickness of the seal resin part 30 in a thin semiconductor package is small, the reinforcing effect by the frame-shaped part 24a is effective, and it can facilitate conveyance and handling of the semiconductor packages 40. Additionally, because the coefficient of thermal expansion of the frame-shaped part 24a is equal to that of the semiconductor chip 12, it is prevented from generating a stress within the seal resin part 30 due to a difference in the coefficients of thermal expansion.

According to the manufacturing method of the semiconductor packages 40 mentioned above, the resin seal process of forming the seal resin part 30 by encapsulating the semiconductor chips 12 by the insulation resin is a one time process as illustrated in FIG. 6, and there is no need to perform the resin sealing process twice. Accordingly, the number of manufacturing processes can be reduced, and the manufacturing cost of the semiconductor package can be reduced.

Moreover, although an interface between a seal resin formed first and a seal resin formed second in a semiconductor package because the seal resin forming process is performed twice according to a conventional method, the resin seal process is performed one time as illustrated in FIG. 6 according to the method of the present embodiment. Thus, there is no interface mentioned above in the semiconductor package according to the present embodiment, thereby eliminating problems caused by such an interface.

Furthermore, the support carrier 24 is formed of the same silicon as the semiconductor chip 12, and a portion of the support carrier 24 remains within the completed semiconductor package 40. Because the frame-shaped part 24a of the support carrier 24 remaining in the semiconductor package 40 serves as a reinforcing member, the support carrier 24 is not a one-time used item, which provides an efficient use of the support carrier 24.

Although the wafer is cut after forming the metal bumps 14 on the wafer to separate (individualize) the semiconductor chips when preparing the individualized semiconductor chips 12, the metal bumps are not always formed at this stage. For example, the formation of the metal bumps 14 can be performed after the semiconductor chips 12 are mounted on the support carrier 24.

In this case, as illustrated in FIGS. 13A and 13B, the process of forming the metal bumps 14 is no longer needed in the process of preparing the individualized semiconductor chips 12. That is, the silicon wafer 10 is prepared as a semiconductor substrate and a plurality of semiconductor chips 12 are formed on the silicon wafer 10 as illustrated in FIG. 13A. Then, the silicon wafer 10 is subjected to back grinding and the die attachment film 16 is applied to the back surface of the silicon wafer 10, and, thereafter, the semiconductor chips 12 are individualized by dicing as illustrated in FIG. 13B.

Then, the thus-individualized semiconductor chips 12 are accommodated in the recesses 20a of the support carrier 24 formed by the process illustrated in FIGS. 3A through 3D, and, thereafter, the metal bumps 14 are formed on the electrodes 12a of the semiconductor chips 12. Thereby, the same state as illustrated in FIG. 5, that is, a state where the semiconductor chips 12 having the metal bumps 14 formed thereon are accommodated in the recesses 20a of the support carrier 24, is achieved.

Thereafter, the semiconductor packages 40 can be formed through the processes illustrated in FIG. 6, FIG. 7, FIG. 8, FIG. 9 and FIG. 11 being performed in that order.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A semiconductor package, comprising:
    a semiconductor chip including a front surface and a back surface opposite to the front surface;
    electrodes formed on the front surface of the semiconductor chip;
    bumps including side surfaces and being formed on the electrodes;
    a seal resin part covering the side surfaces of the bumps and including a top surface and a back surface;
    a rewiring pattern formed on the top surface of said seal resin part;
    a solder resist layer formed on said rewiring pattern and the top surface of said seal resin part except for portions where pads for external connection terminals are formed on said rewiring pattern; and
    a reinforcing member embedded in said seal resin part and including a bottom surface, an upper surface, an inner peripheral side surface, and an outer peripheral side surface, said reinforcing member having a frame shape from a plan view;
    wherein the frame shape surrounds an entire periphery of the semiconductor chip from the plan view;

wherein said bottom surface of said reinforcing member is exposed on said back surface of said seal resin part;

wherein said back surface of said semiconductor chip is flush with said bottom surface of said reinforcing member and said back surface of said seal resin part, wherein the back surface of the semiconductor chip is exposed, wherein the upper surface, the inner peripheral side surface, and the outer peripheral side surface of the reinforcing member are covered by the seal resin part.

2. The semiconductor package as claimed in claim 1, wherein said reinforcing member is formed of silicon.

3. The semiconductor package as claimed in claim 1, wherein the seal resin part entirely covers the upper surface, and the inner and outer peripheral side surfaces of the reinforcing member and exposes the bottom surface of the reinforcing member.

* * * * *